US009146090B2

(12) United States Patent
Grimes et al.

(10) Patent No.: US 9,146,090 B2
(45) Date of Patent: Sep. 29, 2015

(54) NOZZLE ALIGNMENT TOOL FOR A FLUID DISPENSING APPARATUS

(71) Applicant: International Business Machines Corporation, Armonk, NY (US)

(72) Inventors: Jeffrey J. Grimes, South Burlington, VT (US); Dennis P. Hogan, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 156 days.

(21) Appl. No.: 14/079,847

(22) Filed: Nov. 14, 2013

(65) Prior Publication Data

US 2015/0128436 A1 May 14, 2015

(51) Int. Cl.
*G01B 5/25* (2006.01)
*H01L 21/68* (2006.01)
*H01L 21/67* (2006.01)

(52) U.S. Cl.
CPC .............. *G01B 5/25* (2013.01); *H01L 21/6715* (2013.01); *H01L 21/68* (2013.01)

(58) Field of Classification Search
CPC .................................. G01B 5/25; H01L 21/68
USPC ........................................................... 33/645
See application file for complete search history.

(56) References Cited

U.S. PATENT DOCUMENTS

| 3,052,974 | A | * | 9/1962 | Williams | 29/407.04 |
|---|---|---|---|---|---|
| 6,023,336 | A | * | 2/2000 | Hill | 356/399 |
| 6,032,512 | A | | 3/2000 | Li | |
| 6,241,507 | B1 | | 6/2001 | Kuo | |
| 6,463,782 | B1 | * | 10/2002 | Shen et al. | 73/1.79 |
| 6,497,048 | B2 | | 12/2002 | Romero | |
| 6,842,994 | B2 | * | 1/2005 | McInroy | 33/613 |
| 7,284,977 | B2 | * | 10/2007 | Yoshioka et al. | 425/542 |
| 7,506,451 | B1 | * | 3/2009 | Ding et al. | 33/286 |
| 7,581,331 | B2 | | 9/2009 | Wong et al. | |
| 8,267,388 | B2 | * | 9/2012 | Xu | 269/60 |
| 8,947,640 | B2 | * | 2/2015 | Lafarre et al. | 355/72 |
| 2008/0241300 | A1 | * | 10/2008 | Kasahara et al. | 425/144 |

FOREIGN PATENT DOCUMENTS

| JP | 2004-022559 | 1/2004 |
|---|---|---|
| KR | 1020050070440 A | 7/2005 |
| KR | 1020090054737 A | 6/2009 |

* cited by examiner

*Primary Examiner* — Christopher Fulton
(74) *Attorney, Agent, or Firm* — Thompson Hine LLP; Anthony J. Canale

(57) ABSTRACT

Methods and apparatus for adjusting an alignment of a movable component relative to a substrate holder. An alignment tool is placed on the substrate holder. A nozzle is coupled with the movable component. The movable component and the nozzle are positioned such that a planar surface of the movable component contact a planar surface of the alignment tool, and the nozzle has a non-contacting relationship with the alignment tool. The planar surface of the movable component is leveled to be parallel with the planar surface of the alignment tool.

20 Claims, 10 Drawing Sheets

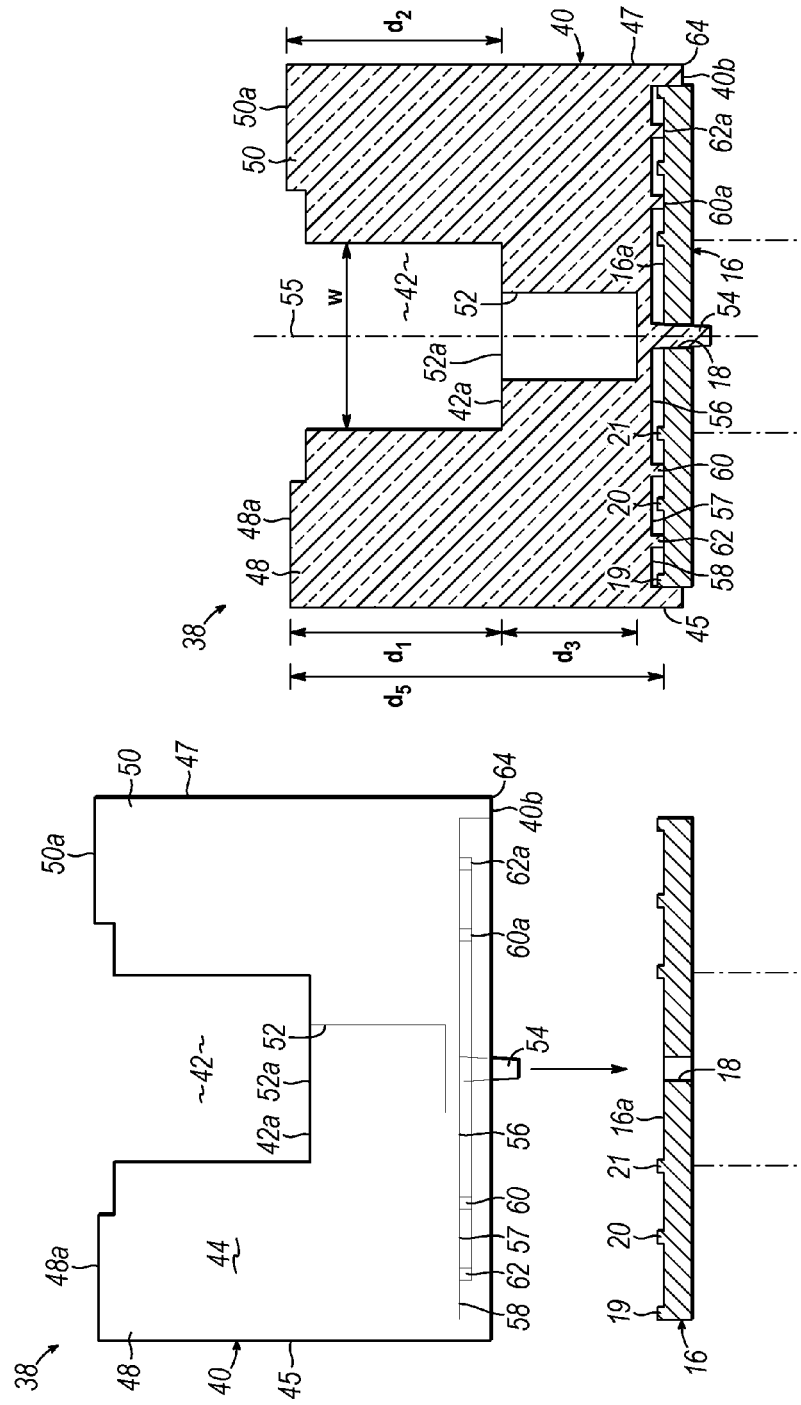

NOZZLE ALIGNMENT TOOL FOR A FLUID DISPENSING APPARATUS

BACKGROUND

The invention relates generally to semiconductor processing and, in particular, to apparatus and methods for centering and leveling components in a fluid dispensing apparatus, such as a coater.

A coater is used to apply resist layers during photolithography processing used to manufacture integrated circuits. Photolithography is a standard technique utilized during the manufacture of chips to transfer geometric shapes and patterns from a mask to one or more layers of material on a wafer. The basic photolithographic process includes exposing a sacrificial layer of a radiation-sensitive material, such as a light-sensitive photoresist layer, to a light source (e.g., a deep ultraviolet light source) projected through a patterned mask and then developing the exposed radiation-sensitive material to, for example, remove the exposed material and impart the pattern to the sacrificial layer. Among its other functions, a coater is used to dispense solutions, such as a solution containing the radiation-sensitive material, dispensed from a nozzle onto the top surface of a rotating wafer, which is held on and spun by a spin chuck.

Apparatus and methods are needed for use with existing coaters and other types of fluid dispensing apparatus to provide component centering and leveling.

SUMMARY

In an embodiment of the invention, a method is provided for adjusting an alignment of a movable component relative to a substrate holder. The method includes placing an alignment tool on the substrate holder, coupling a nozzle with the movable component, and positioning the movable component and the nozzle to contact a planar surface of the movable component with a planar surface of the alignment tool. The method further includes leveling the planar surface of the movable component to be parallel with the planar surface of the alignment tool.

In an embodiment of the invention, an apparatus is provided for adjusting an alignment of a movable component relative to a substrate holder. The movable component is configured to be coupled with a nozzle having a tip, and the movable component including a planar surface. The apparatus includes an alignment tool configured to be removably positioned on the substrate holder. The alignment tool has a first planar surface configured to be contacted by the movable component, a second planar surface configured to be coupled with the substrate holder, and a channel adjacent to the first planar surface. The first planar surface is parallel to the second planar surface and spaced relative to the second planar surface along an axis. The first planar surface is spaced from the channel along the axis such that the movable component can contact the first planar surface while the tip of the nozzle has a non-contacting relationship with the alignment tool.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 4 is an exploded view illustrating the assembly of the alignment tool with the spin chuck.

FIG. 5 is a cross-sectional view illustrating the assembled the alignment tool and the spin chuck.

DETAILED DESCRIPTION

Figure 1:
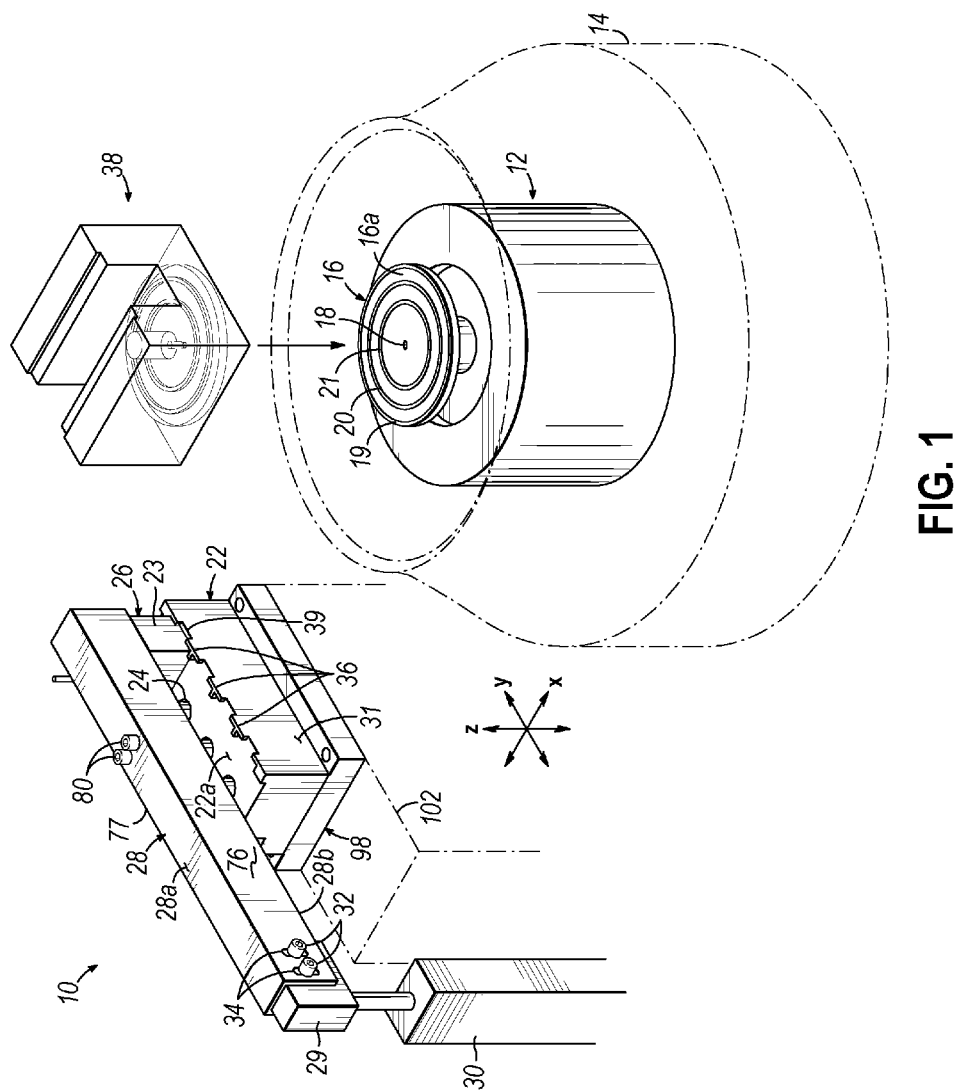
FIG. 1 is a perspective view of a station of a coater and an alignment tool in accordance with an embodiment of the invention.

With reference to FIG. 1 and in accordance with an embodiment of the invention, a fluid dispensing apparatus 10 includes a substrate holder in the representative form of a spin chuck 12 and a nozzle storage block 22 configured with a plurality of storage sites. The fluid dispensing apparatus 10 may be a coater. A wafer is secured to the spin chuck 12 by, for example, the application of a vacuum to its rear surface. The spin chuck 12 is positioned inside of a bowl 14. The spin chuck 12 includes a platen 16 with an opening 18 and a plurality of features in the representative form of circumferentially-extending ridges 19, 20, 21. The ridges 19, 20, 21 constitute features that may be arranged concentric with the opening 18, and the opening 18 may be located at the geometrical center of the platen 16. The ridges 19, 20, 21 are characterized by different diameters with the ridge 19, which is being located at the outer rim of the platen 16, having the largest diameter.

A top surface 16a of the platen 16, which is located between adjacent pairs of the ridges 19, 20, 21 and between the inner ridge 21 and the opening 18, may be flat and planar so as to establish a reference plane. The ridges 19, 20, 21 project above the top surface 16a of the platen 16 by a height, $h_1$. The ridges 19, 20, 21 may likewise be flat and coplanar to lie in a plane that is raised above the reference plane established by the top surface 16a of the platen 16 by height, $h_1$. A wafer with a backside supported by the ridges 19, 20, 21 on the platen 16 is therefore located in a plane that is parallel to the plane of the top surface 16a.

The nozzle storage block 22 includes multiple storage sites each configured to be populated by a nozzle 26 with adjacent nozzles 26 arranged in a side-by-side or juxtaposed relationship. The nozzle storage block 22 is multi-sided with a side surface 31 and a top surface 22a that intersects the side surface 31 at a corner that may be a right angle corner. A set of ridges 36 is located along an edge 39 of the top surface 22a, and another set of ridges 37 (FIG. 6) is located along an edge of the top surface 22a opposite from edge 39. The edge 39 of the top surface 22a is located nearer to the spin chuck 12 than the opposite edge of the top surface 22a. The top surface 22a of the nozzle storage block 22 may be flat and planar, and may be contained in a plane.

Figure 7:
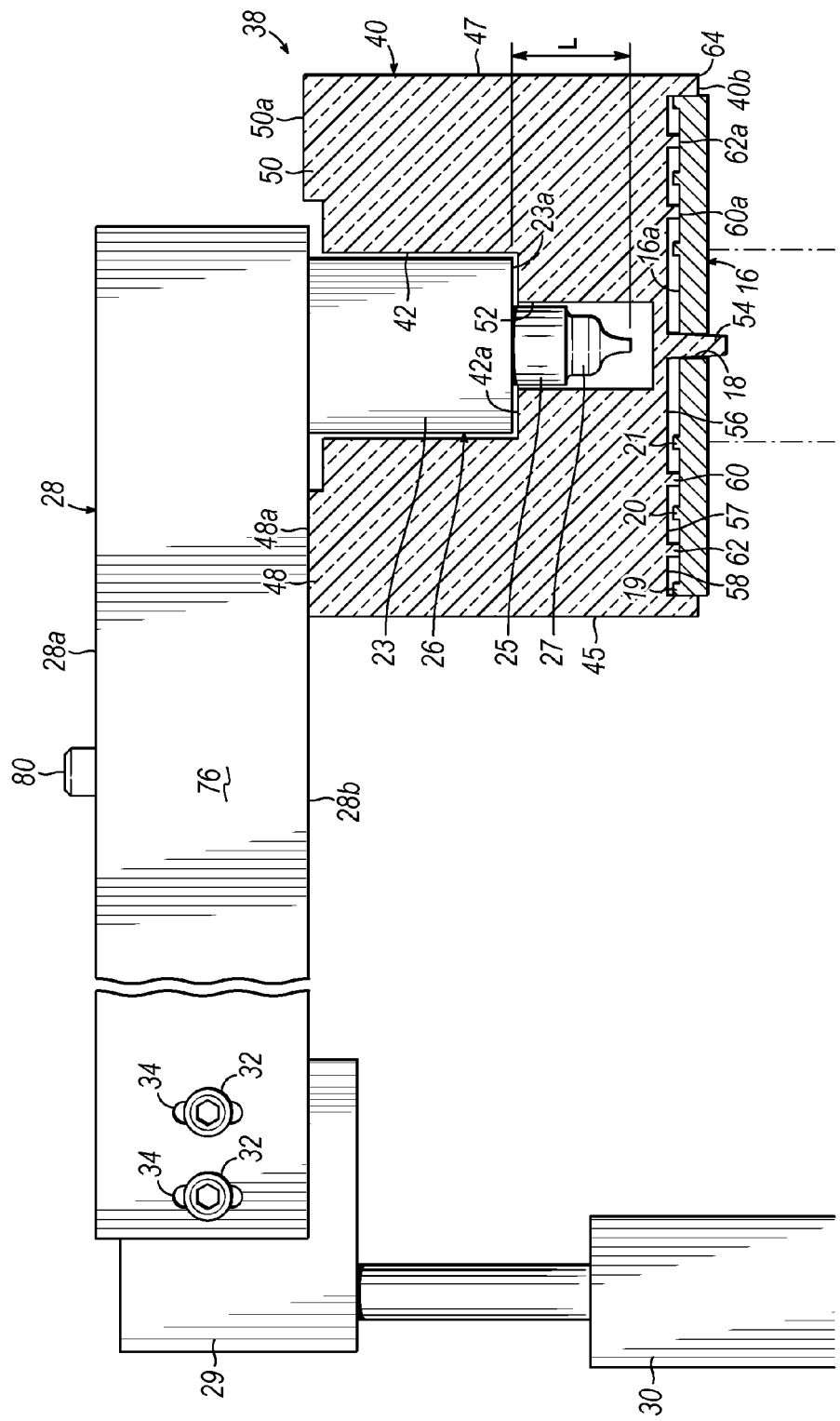
FIG. 7 is a cross-sectional view of the alignment tool and the nozzle arm illustrating the arrangement during the centering/leveling procedure.
Figure 8:
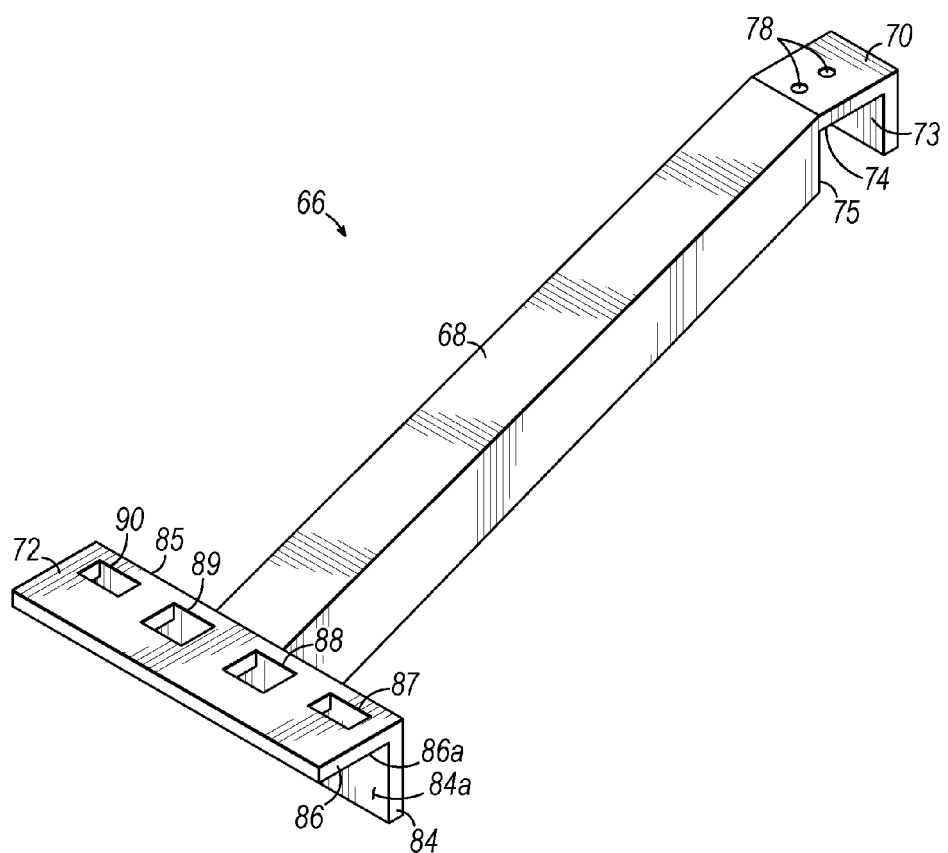
FIG. 8 is a perspective view of an alignment tool in accordance with an embodiment of the invention.
Figure 9:
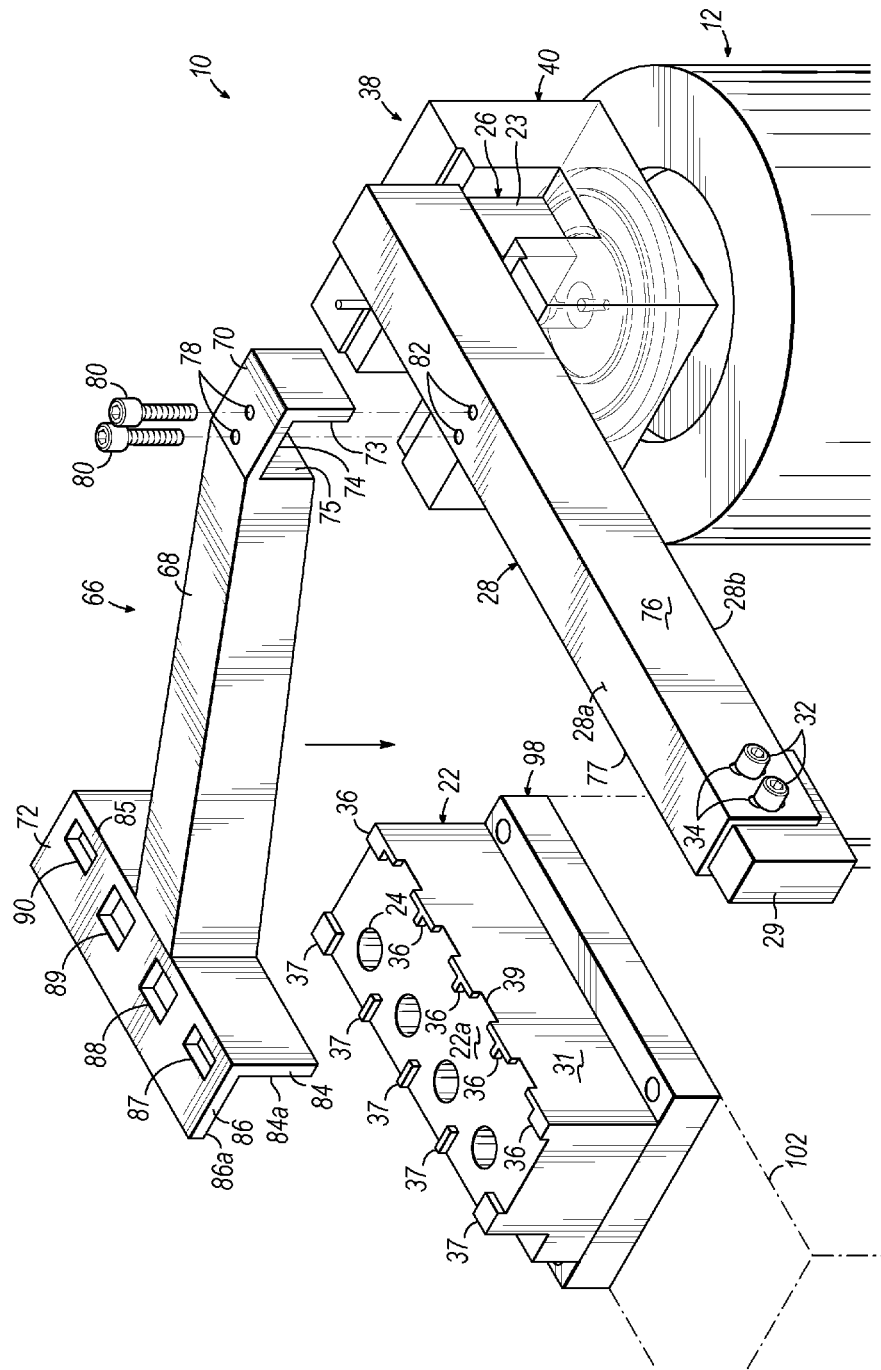
FIG. 9 is a perspective view similar to FIG. 6 in which the alignment tool of FIG. 8 is used to level the nozzle storage block with the nozzle arm to perform an additional phase of the centering/leveling procedure.
Figure 10:
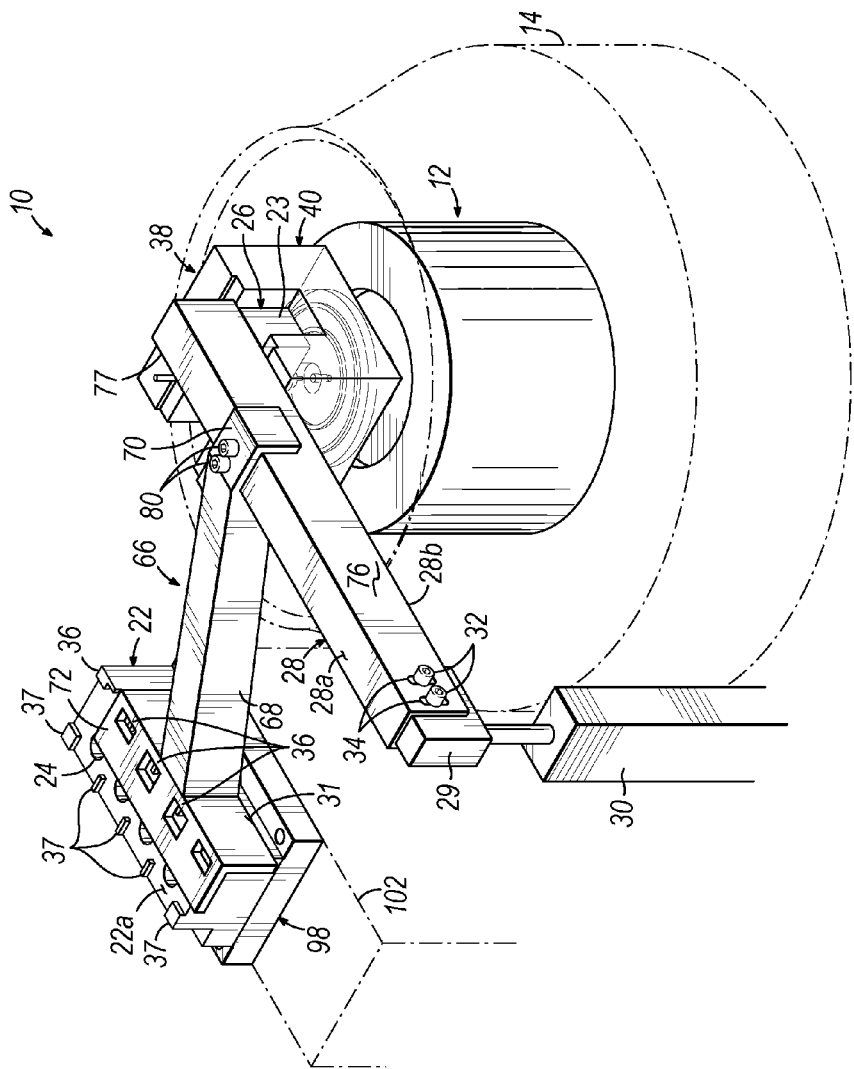
FIG. 10 is an exploded view illustrating the assembly of the alignment tool of FIG. 8 with the nozzle arm and the nozzle storage block.
Figure 11:
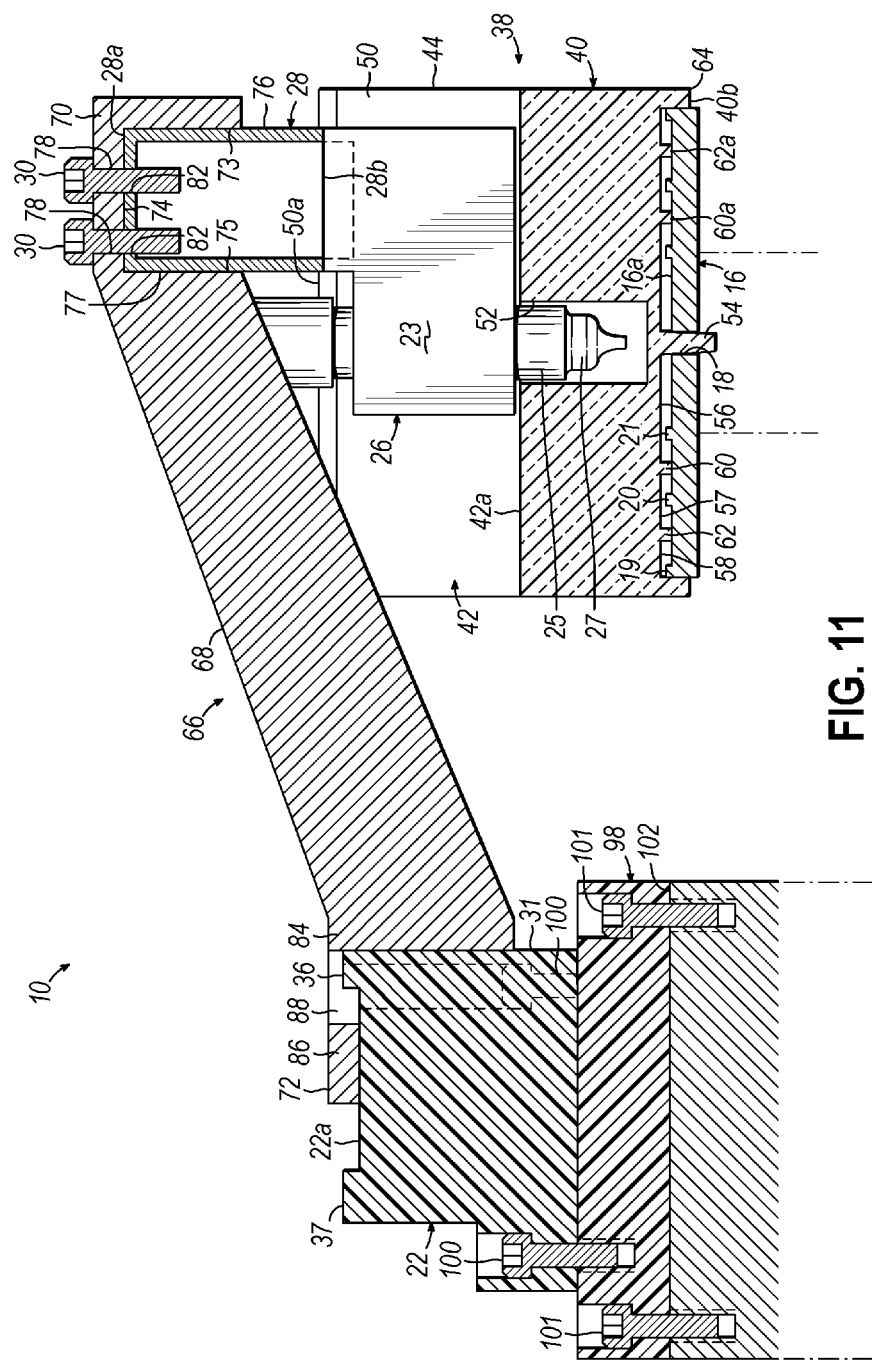
FIG. 11 is a cross-sectional view of the alignment tool of FIG. 8, the nozzle arm, and the nozzle storage block illustrating the arrangement during the centering/leveling procedure.

The nozzle 26 includes a body 23, a collar 25, and a tip 27 separated from the body 23 by the collar 25 (FIG. 7). The collar 25 and the tip 27, which are smaller in cross-section than the body 23 and project from the body, are disposed inside of an opening 24 at each storage site in the nozzle storage block 22. The body 23 of the nozzle 26 includes a flat bottom surface 23a (FIG. 7) that contacts the top surface 22a of the nozzle storage block 22 at the storage site for the nozzle 26. The ridges 36, 37 are used to compartmentalize and locate a body 23 of the nozzle 26 held at each storage site of the nozzle storage block 22. A collar 25 and a tip 27 (FIG. 7) of the nozzle 26 are disposed inside of an opening 24 at each storage site in the nozzle storage block 22. The diameter of the collar 25 is greater than a diameter of the tip 27. The tip 27 of the nozzle 26 may have a non-contacting relationship with the sidewall of the opening 24.

The nozzle 26 receives a chemical solution, such as a resist solution, or another fluid or liquid, through a supply line, and dispenses the chemical solution from the tip 27. Additional nozzles like nozzle 26 may receive solutions of different chemistries through independent supply lines and dispense those solutions onto the front surface of the wafer on the platen 16 of spin chuck 12. The chemical solution is typically dispensed by nozzle 26 onto the wafer center. The spin chuck 12 is configured to rotate at a high angular velocity to spread the solution uniformly across the front surface of a wafer. As the spin chuck 12 rotates, the solution spreads radially outward from the center of the wafer toward the outer circumference of the wafer by centrifugal force.

The fluid dispensing apparatus 10 further includes a nozzle arm 28 that is configured to releasably grip the nozzle 26 and a support arm 30 configured to move the nozzle arm 28 and the gripped nozzle 26 from the nozzle storage block 22 to the spin chuck 12. For example, the nozzle arm 28 may be equipped with a set of mechanical fingers that are configured to releasably clamp the nozzle 26. The nozzle 26 that is gripped is selected from all nozzles 26 populating the storage sites of the nozzle storage block 22. After the nozzle 26 is removed from the nozzle storage block 22, the nozzle 26 is suspended by the nozzle arm 28 above the wafer on the spin chuck 12 when dispensing its solution onto the center of the front surface of the wafer.

The support arm 30 is also configured to move the nozzle arm 28 vertically so that the spacing between the tip 27 of the nozzle 26 and a top surface 16a of the platen 16 of the spin chuck 12 can be adjusted. The support arm 30 may comprise a bi-directional motor assembly that is connected to a source of electrical power. The support arm 30 provides a driven component that is coupled with the movable component represented by the nozzle arm 28 and that moves the nozzle arm 28 laterally relative to the spin chuck 12 and vertically relative to the spin chuck 12. A controller may be in electrical communication with the motor, which is adapted to receive signals from the controller. The controller includes a suitable microprocessor for controlling the operation of the motor and functions to generate appropriate signals to the motor for laterally moving the support arm 30 in one direction or the other relative to the spin chuck 12. The controller may comprise part of an overall control system for the fluid dispensing apparatus 10 and may include an input device in electrical communication with the controller for allowing a user to selectively control the delivery of electrical energy to the motor so that, for example, the user can precisely move the nozzle arm 28 and support arm 30 during a centering/leveling procedure.

The support arm 30 includes a mounting block 29 and the nozzle arm 28 is coupled with threaded openings in the mounting block 29 by a plurality of fasteners 32, such as machine bolts. The shanks of the fasteners 32 are received in slotted openings 34 in the nozzle arm 28. The nozzle arm 28 includes a top surface 28a and a bottom surface 28b on an opposite side from the top surface 28a. The top surface 28a and the bottom surface 28b of the nozzle arm 28 may be flat and planar, and may be disposed in respective planes that are parallel and displaced vertically. When the fasteners 32 are loosened, the inclination of the surfaces 28a, 28b of nozzle arm 28 can be adjusted.

An alignment aid or tool 38 is configured to be manually engaged with the spin chuck 12. The alignment tool 38 can be used to level the reference plane of the top surface 16a of the platen 16 of spin chuck 12 relative to a reference plane containing the bottom surface 28b of the nozzle arm 28.

Figure 3:
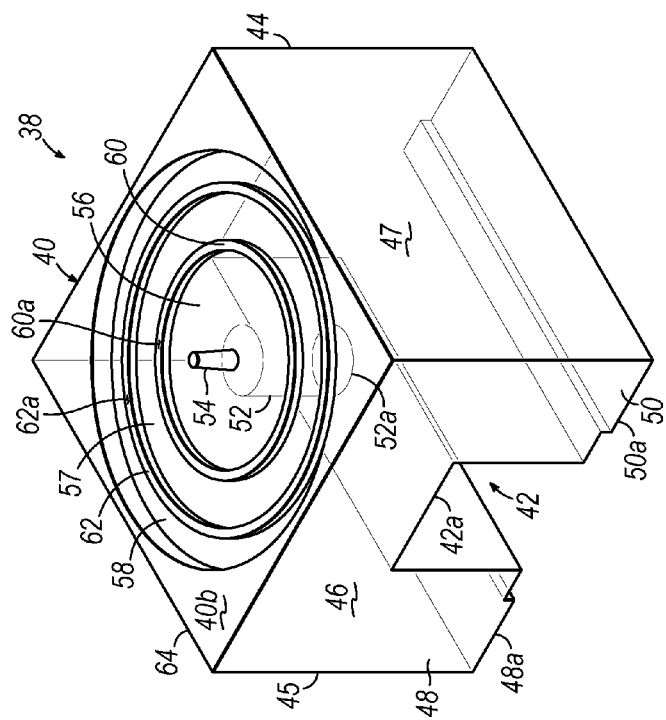
FIG. 3 is an isometric bottom view of the alignment tool of FIG. 1.
Figure 2:
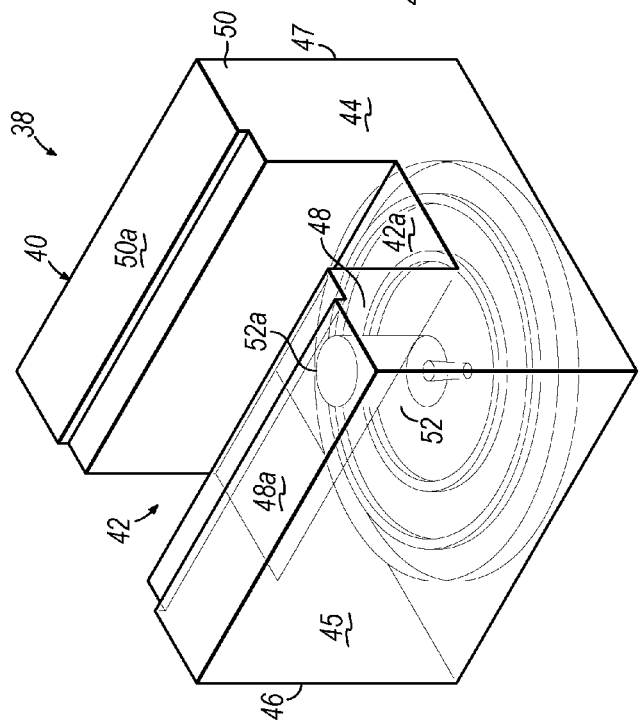
FIG. 2 is an isometric top view of the alignment tool of FIG. 1.

With reference to FIGS. 2 and 3 in which like reference numerals refer to like features in FIG. 1, the alignment tool 38 includes a plurality of side surfaces 44, 45, 46, 47 and an open-ended groove or channel 42 extending from the side surface 44 to the side surface 46. The channel 42 is bounded by ridges 48, 50 that likewise extend between the side surfaces 44, 46 and that are raised relative to a top surface 42a of the channel 42. Ridge 48 has a top surface 48a and ridge 50 has a top surface 50a, each of which is flat and planar.

The bottom surface 40b of the block 40 includes a stem 54 that is encircled by a set of recesses 56, 57, 58. The opening 52 and the stem 54 may be aligned along a common centerline or axis 55. The recess 56 surrounds the stem 54, a feature in the form of a ridge 60 is disposed between recess 56 and recess 57, and a feature in the form of a ridge 62 is disposed between recess 57 and recess 58. The ridges 60, 62 and recesses 57, 58 are annular in geometrical shape, and the recess 56 is round or disk-shaped. The ridges 60, 62 and recesses 57, 58 are of progressively increasing diameter and may be concentric. The alignment tool 38 may be comprised of a transparent or translucent material, such as polymethylmethacrylate (PMMA) or another polymer, that is machined to provide the various features. A user can visualize the nozzle 26 in the opening 52 through the material of the block 40, which allows visual alignment and may ease operation.

Figure 5A:
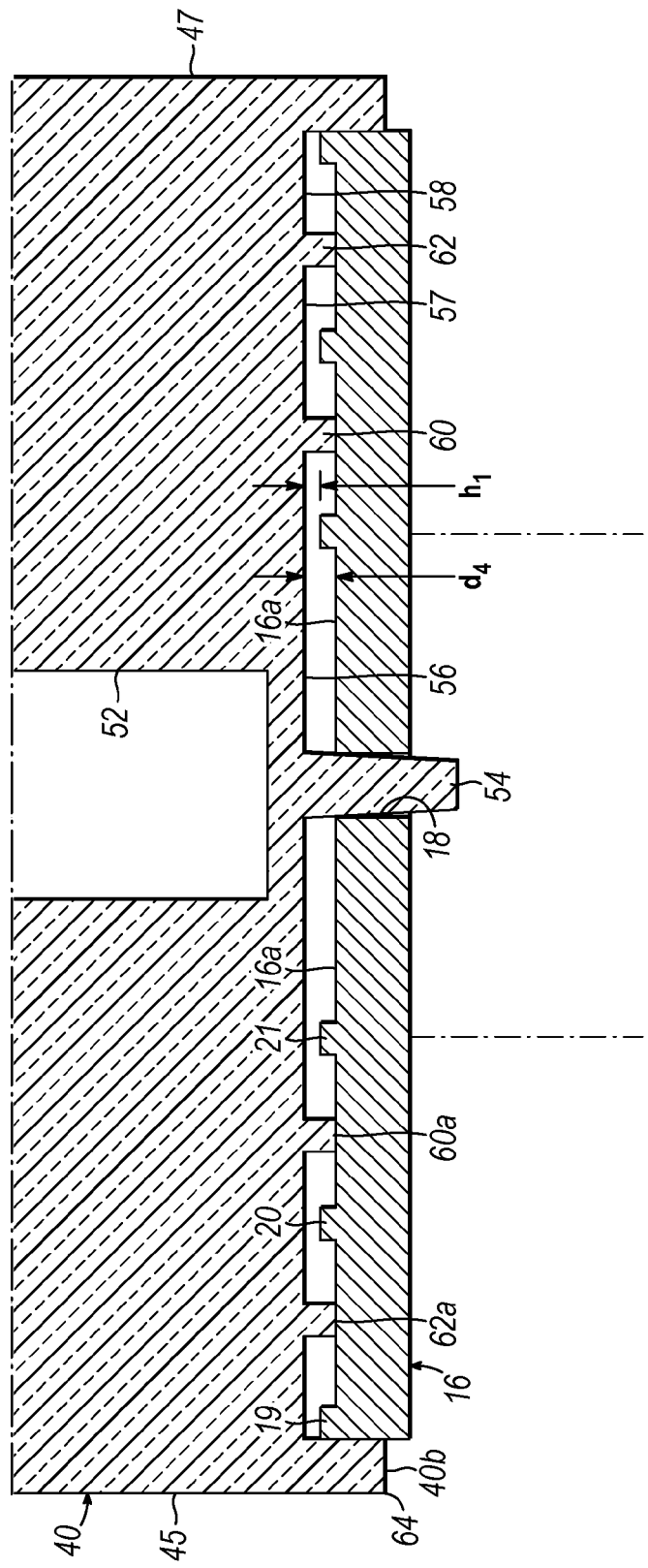
FIG. 5A is an enlarged view of a portion of FIG. 5.

With reference to FIGS. 4, 5, and 5A in which like reference numerals refer to like features in FIGS. 1-3, the alignment tool 38 is installed on the spin chuck 12 to perform a centering/leveling procedure. The installation of the alignment tool may be manual. To that end, the alignment tool 38 is held by hand and moved vertically relative to the spin chuck 12 until a centered and contacting relationship is established. The vacuum that is normally applied from the spin chuck 12 to the wafer during a solution-dispensing operation may be applied to the alignment tool 38 during a centering/leveling procedure.

When the alignment tool 38 is coupled with the spin chuck 12, the ridges 60, 62 and recesses 56, 57, 58 face toward the top surface 16a of platen 16, the channel 42 opens in a direction away from the top surface 16a of platen 16, and the ridges 48, 50 project away from the top surface 16a of platen 16. The surfaces 60a, 62a of the ridges 60, 62 on the alignment tool 38, which are portions of the bottom surface 40b of the block 40, are brought into a contacting relation with the top surface 16a of the platen 16. The surfaces 60a, 62a collectively comprise a surface area that contacts the top surface 16a and, when contacting during the centering/leveling procedure are contained in a plane that is parallel to the plane containing the top surface 16a.

The stem 54 on the block 40 fits into the opening 18 at the center of the platen 16 of the spin chuck 12 so that the alignment tool 38 is centered on the spin chuck 12. The opening 18 in the platen 16 of the spin chuck 12 is aligned with the axis 55 shared by the opening 52 and stem 54. The common center for the openings 18, 52 provides a reference on the alignment tool 38 for centering the nozzle 26 in the x-direction and y-direction (i.e., in an x-y plane) with precision movements of the nozzle arm 28 and support arm 30.

The ridges 19, 20, 21 on the spin chuck 12 fit into the recesses 56, 57, 58 with a non-contacting relationship. The inner ridge 19 on the spin chuck 12 fits into the central recess 56, the middle ridge 20 on the spin chuck 12 fits into the middle recess 57, and the outer ridge 19 at the rim of the spin chuck 12 fits into the outer recess 58. The ridges 60, 62 and recesses 56, 57, 58 are located inside of an outer perimeter 64 of the bottom surface 40b of the block 40. The ridges 19, 20, 21 on the spin chuck 12, the recesses 56, 57, 58 on the alignment tool 38, and the ridges 60, 62 on the alignment tool 38 are generally circular or round in shape. The inner ridge 21 on the spin chuck 12 has a diameter that is less than the diameter of the inner ridge 60 on the alignment tool 38 so that the inner ridge 21 is located in the recess 56. The middle ridge 20 on the spin chuck 12 has a diameter that is less than the diameter of the outer ridge 62 on the alignment tool 38 so that the middle ridge 20 is located in the recess 57. The outer ridge 19 on the spin chuck 12 has a diameter that is greater than the diameter of the outer ridge 62 and less than the outer diameter of the recess 58 on the alignment tool 38 so that the outer ridge 19 is located in the recess 58.

The ridges 19, 20, 21 are characterized by different diameters with the ridge 19, which is being located at the outer rim of the platen 16, having the largest diameter.

The recesses 56, 57, 58 have a depth, $d_4$, that is greater than the height, $h_1$, of the ridges 19, 20, 21 of the spin chuck 12 so that, when the alignment tool 38 is installed on the spin chuck 12, the ridges 19, 20, 21 have a non-contacting relationship relative to the alignment tool 38. The bottom surface 60a, 62a on the ridges 60, 62 contacts the platen 16 such that the contact points between the alignment tool 38 and the spin chuck 12 are in locations that are non-contact points for the wafer with the spin chuck 12, which may assist in minimizing wafer defectivity.

The surfaces 60a, 62a on the ridges 60, 62 at the top surface of the alignment tool 38 are flat and coplanar, and are contained in a plane. The top surface 48a of ridge 48 is displaced vertically from the surfaces 60a, 62a by a spacing and the top surface 50a of ridge 50 is displaced vertically from the surfaces 60a, 62a by a spacing. The plane containing surfaces 60a, 62a is parallel to the plane containing surface 48a and to a plane containing surface 50a. When the surfaces 60a, 62a are in a contacting relationship with the top surface 16a of the platen 16, the plane of the top surface 16a and the plane of the surfaces 60a, 62a are parallel. As a result, the planarity of the top surface 16a is transferred to the surfaces 48a, 50a, which are displaced vertically from top surface 16a by respective spacings. The surfaces 60a, 62a are spaced from the surface 48a by a distance, $d_5$, and the distance between surface 50a and surfaces 60a, 62 is given by the distance, $d_5$, modified by the height difference between distance $d_1$ and distance $d_2$, if any, between the surfaces 48a, 50a.

The top surface 42a of the channel 42 is recessed relative to the top surface 48a of ridge 48 by a depth or distance, $d_1$. The top surface 42a of the channel 42 is recessed relative to the top surface 50a of ridge 50 by a depth or distance, $d_2$. Distance, $d_1$, may differ from distance, $d_2$, which permits that alignment tool 38 to be used with nozzles 26 of different height through a selection of the ridge 48 or 50 used in the centering/leveling procedure.

The channel 42 has a width, w, between the ridges 48, 50 that is greater than the width of the body 23 of the nozzle 26 such that the nozzle 26 can enter into the channel 42 at one or the other of the side surfaces 44, 46 and can fit within the channel 42 without contacting either of the ridges 48, 50. An entrance 52a to an opening 52 is located inside the channel 42. The opening 52 has a depth given by a distance, $d_3$, that is measured relative to the top surface 42a of the channel 42. The various distances and the width, w, may be in conjunction with knowledge of the nozzles 26, including dimensions, that will be used by the fluid dispensing apparatus 10.

Figure 6:
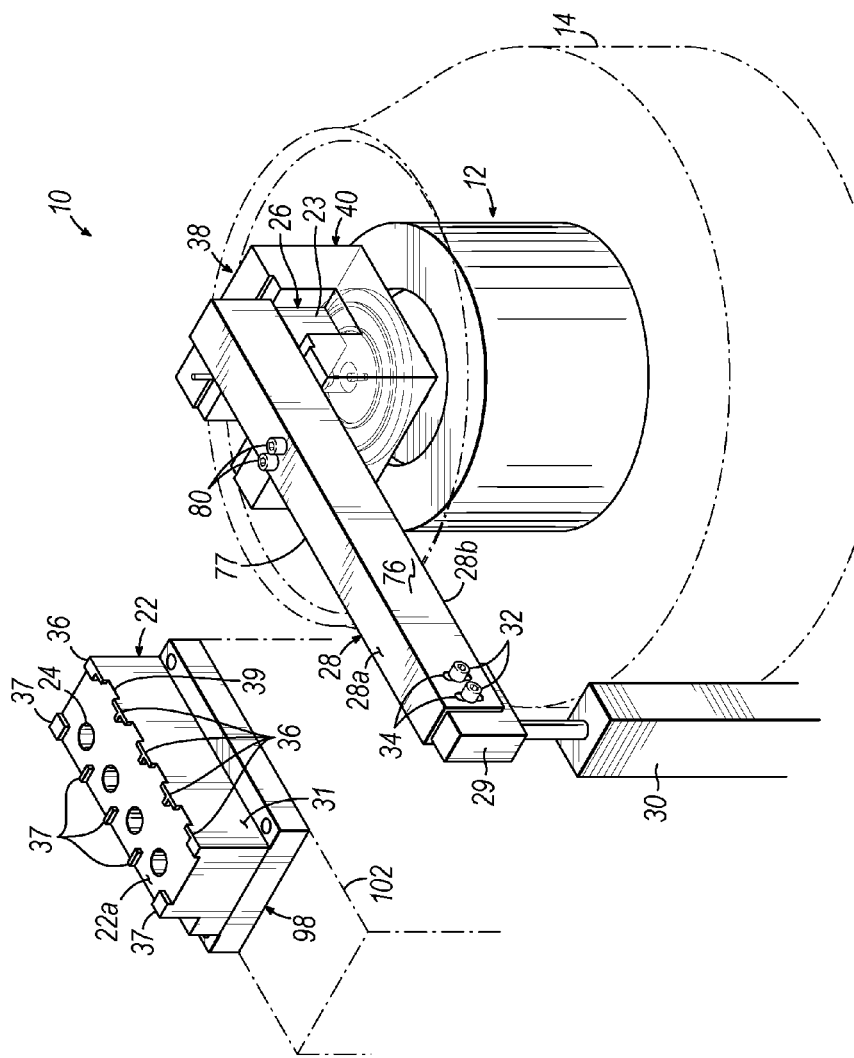
FIG. 6 is a perspective view similar to FIG. 1 in which the nozzle arm is moved into contact with an alignment tool to perform a centering/leveling procedure.

With reference to FIGS. 6 and 7 in which like reference numerals refer to like features in FIGS. 1-5, the alignment tool 38 is rotationally oriented on the spin chuck 12 so that the channel 42 is aligned with the direction in which the nozzle 26 is moved by the nozzle arm 28. The operator has a choice of rotationally orienting the alignment tool 38 such that either ridge 48 or ridge 50 is nearer to the support arm 30. In the representative embodiment, the ridge 48 is nearer to the support arm 30 than ridge 50. Alternatively, the alignment tool 38 may be rotated by 180° so that ridge 50 is nearer to the support arm 30 than ridge 48. Because of the rotational orientation of the alignment tool 38, only one or the other of the ridges 48, 50 participates in the centering/leveling procedure. This flexibility permits the operator using the alignment tool 38 to select two different spacings from the tip 27 of the nozzle 26 to a wafer held on the spin chuck 12 to comply with different process specifications.

After the nozzle 26 is gripped by the nozzle arm 28 at the nozzle storage block 22, the nozzle arm 28 is operated to laterally translate the nozzle 26 from a position at its storage site in the nozzle storage block 22 to a position centered over the platen 16 of the spin chuck 12. The nozzle 26 enters the channel 42 at one or the other of the side surfaces 44, 46 depending on the rotational orientation of the alignment tool 38. The nozzle 26 is positioned in vertical alignment with the opening 52 in the alignment tool 38.

The nozzle arm 28 is then operated to move the nozzle 26 vertically relative to the top surface 16a of the platen 16 of the spin chuck 12. Specifically, the nozzle arm 28 is lowered until the surfaces 48a, 50a are in a contacting relationship with the top surface 16a of the platen 16. As the nozzle arm 28 lowers, the bottom surface 28b of the nozzle arm 28 contacts one or the other of the surfaces 48a, 50a. As depicted in FIG. 7, the bottom surface 28b of the nozzle arm 28 has a contacting relationship with the surface 48a of ridge 48.

The tip 27 of the nozzle 26 is located inside the opening 52 and has a non-contacting relationship with the alignment tool 38. The opening 52 inside the channel 42 is dimensioned and configured to receive the collar 25 and tip 27 of the nozzle 26. The opening 52 has a diameter that is greater than a diameter of the collar 25 (FIG. 7) of the nozzle 26 so that the tip 27 of the nozzle 26 can enter the opening 52 without contacting the sidewall. When the tip 27 is located inside the opening 52 during a centering/leveling procedure, the collar 25 of the nozzle 26 is spaced with a clearance from the sidewall of the opening 52. The depth of the opening 52, which is represented by the distance, $d_3$, is selected such that the tip 27 of the nozzle 26 does not contact the bottom of the opening 52 when the nozzle 26 is located inside the opening 52 during a centering/leveling procedure. Any incidental or accidental contact that might occur during a centering/leveling procedure occurs between the collar 25 of nozzle 26 and the sidewall of the opening 52.

The opening 52 in the alignment tool 38 is used to center the nozzle 26 relative to the platen 16 of the spin chuck 12. An operator may visualize the clearance between the nozzle 26 and the sidewall of the opening 52, and adjust the x-position and y position of the nozzle 26 so that the radial distance between the collar 25 of the nozzle 26 and the sidewall of the opening 52 is uniform about the circumference of the gap. This adjustment centers the nozzle 26 in the x-direction and y-direction (i.e., in the x-y plane).

In a centering/leveling procedure, the fasteners 32, which are located in threaded openings in the mounting block 29, are loosened without removal from the threaded openings. The tip of a tool can be engaged with the head of each fastener 32 and rotated to apply a force in a sense that loosens the fastener 32 and withdraws the fastener 32. The loosening of the fasteners 32 frees the nozzle arm 28 for movement to the extent that the fasteners 32 can move within the slotted openings 34. The nozzle arm 28 is now a movable component relative to the stationary alignment tool 38 and can be tilted and/or displaced over a range of motion limited by the length of the slotted openings 34.

With the fasteners 32 loosened, the nozzle arm 28 is manually manipulated until its bottom surface 28b rests level on the top surface 48a of ridge 48. The surfaces 28a, 48a are considered level when contacting with no intervening gap. This portion of the centering/leveling procedure transfers the planarity of the top surface 48a to top surface 28a of the nozzle arm 28 such that the plane of the top surface 48a is parallel to the plane of the top surface 16a of the platen 16. With this relationship established, the fasteners 32 are tightened to secure the nozzle arm 28 against unintended motion relative to the mounting block 29. The tip of the tool can be engaged with the head of each fastener 32 and rotated in an opposite sense to apply a force in a direction that advances the fastener 32 and tightens the fastener 32.

With reference to FIG. 8-11 in which like reference numerals refer to like features in FIGS. 1-7, an alignment aid or tool 66 may be used to level the top surface 22a of the nozzle storage block 22 relative to the nozzle arm 28 in a stage of the centering/leveling procedure subsequent to the use of the alignment tool 38 to level the nozzle arm 28 with the spin chuck 12. The centering/leveling procedure is performed with all of the storage sites emptied of nozzles 26 so that the ridges 36, 37 and the top surface 22a of the nozzle storage block 22 are exposed without obstruction. The alignment tool 66 includes an arm 68, a bracket 70 defined by a notched section formed at one end of the arm 68, and a bracket 72 defined by an angled section formed at an opposite end of the arm 68. The arm 68 is rigid and the brackets 70, 72 are rigidly affixed to the opposite ends of the arm 68. The bracket 72 extends transverse to the arm 68. The arm 68 may be angled to account for a difference in the relative vertical positions of the top surface 28a of the nozzle arm 28 and the top surface 22a of the nozzle storage block 22.

The bracket 70 of the alignment tool 66 is dimensioned and shaped to snuggly receive the nozzle arm 28 in its interior with the interior surfaces 73, 74, 75 of the bracket 70 contacting the nozzle arm 28. In particular, the interior surface 74 of the bracket 70 contacts the top surface 28a of the nozzle arm 28, and the interior surfaces 73, 75 contact side surfaces 76, 77 of the nozzle arm 28. Threaded fasteners 80 are inserted through fastener openings 78 in the bracket 70 and engaged with complementary threaded fastener openings 82 in the nozzle arm 28 that are accessible from the top surface 28a. In this manner, the alignment tool 66 is temporarily coupled with the nozzle arm 28.

The bracket 72 of the alignment tool 66 includes a flange 84, a flange 86 that joins flange 84 along an edge 85, and a plurality of openings 87, 88, 89, 90 formed in the flange 86. When the bracket 72 is coupled with the nozzle storage block 22, the openings 86-89 are configured to engage the ridges 36 on the nozzle storage block 22 at multiple storage sites. The openings 87-90 are rectangular in shape and vary in size. In the latter regard, the central openings 88, 89 are larger in size than the peripheral openings 87, 90 with nominally the same width and a larger length. In the representative embodiment, the openings 87-90 engage fewer than all of the ridges 36 and, in particular, only engage the three central ridges 36 and one or the other of the ridges 36 at the outer periphery along edge 39 of the nozzle storage block 22. The openings 87, 90 can be smaller because the ridges 36 at the corners of the surface 22a are smaller than the central ridges 36.

During the centering/leveling procedure, a surface 84a of the flange 84 of bracket 72 has a contacting relationship the side surface 31 of the nozzle storage block 22 and a surface 86a of the flange 86 of bracket 72 has a contacting relationship the top surface 22a of the nozzle storage block 22. Edge 39 of the nozzle storage block 22 is coextensive with edge 85 of the bracket 72. The angling of the arm 68 places the surface 86a of bracket 72 and the surface 74 of bracket 70 to accommodate the difference in the relative vertical positions of the top surface 28a of the nozzle arm 28 and the top surface 22a of the nozzle storage block 22.

The nozzle storage block 22 is attached to a base 98 by a plurality of fasteners 100. With the alignment tool 66 placed in its bridging position and affixed to the nozzle arm 28, the x-y position of the nozzle storage block 22 may be adjusted by loosening the fasteners 100 to free the nozzle storage block 22 for movement relative to the base 98. Contact between the surface 84a of the flange 84 and the side surface 31 of the nozzle storage block 22, when made flush during positional adjustment, is used to align the nozzle storage block 22 to be parallel to the nozzle arm 28. The fasteners 100 are then tightened to establish the parallel relationship between the planes of the surfaces 84a, 31.

The top surface 22a and the surface 86a can be leveled by moving the nozzle storage block 22 to make the plane of the top surface 22a parallel to the plane of the top surface 28a. The base 98 is attached by a plurality of fasteners 101, such as set screws, to a support surface 102. With the alignment tool 66 placed in its bridging position and affixed to the nozzle arm 28, the fasteners 101 are turned to raise or lower the base 98 supporting the nozzle storage block 22 to establish the leveled and parallel relationship between the planes of the surfaces 22a, 86a.

The use of one or both of the alignment tools 38, 66 lessens human subjectivity during a centering/leveling operation. The delicate tip 27 of the nozzle 26 does not contact the alignment tool 38 during the centering/leveling operation. The ridges 19, 20, 21 on the spin chuck 12 do not contact the alignment tool 38 during the centering/leveling operation. The alignment tool 66 permits the top surface 22a of the nozzle storage block 22 to also be leveled with the spin chuck 12 so that, when a nozzle 26 is gripped by the nozzle arm 28, the tip 27 will be more likely to be aligned perpendicular to the plane of the wafer held by the spin chuck 12.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for adjusting an alignment of a movable component relative to a substrate holder, the method comprising:
   placing an first alignment tool on the substrate holder;
   coupling a nozzle with the movable component;
   positioning the movable component and the nozzle to contact a first planar surface of the movable component with a first planar surface of the first alignment tool; and
   leveling the first planar surface of the movable component to be parallel with the first planar surface of the first alignment tool.

2. The method of claim 1 wherein a tip of the nozzle has a non-contacting relationship with the first alignment tool when the first planar surface of the movable component is leveled with the first planar surface of the first alignment tool.

3. The method of claim 2 wherein the first alignment tool has an opening that is aligned with a centerline of the substrate holder, and further comprising:
   receiving the tip of the nozzle in the opening when the first planar surface of the movable component contacts the first planar surface of the first alignment tool.

4. The method of claim 3 wherein the nozzle includes a collar having a greater diameter than the tip, and further comprising:
   adjusting a gap between the collar of the nozzle and a sidewall of the opening to establish a position in an x-y plane parallel to the first planar surface of the first alignment tool.

5. The method of claim 1 wherein leveling the first planar surface of the movable component with the first planar surface of the first alignment tool comprises:
   loosening a plurality of fasteners that secure the movable component with a driven component used to move the movable component relative to the substrate holder; and
   adjusting an inclination of the movable component to level the first planar surface of the movable component with the first planar surface of the first alignment tool.

6. The method of claim 1 wherein the first planar surface of the movable component and the first planar surface of the first alignment tool are in parallel planes when the first planar surface of the movable component is leveled with the first planar surface of the first alignment tool.

7. The method of claim 1 wherein the movable component includes a second planar surface that parallel to the first planar surface of the movable component, the nozzle is coupled with the movable component at a nozzle storage block, and the movable component and the nozzle are moved relative to the nozzle storage block, and further comprising:
   leveling a planar surface of the nozzle storage block with the second planar surface of the movable component.

8. The method of claim 7 wherein leveling the first planar surface of the nozzle storage block with the first planar surface of the first alignment tool comprises:
   placing a first planar surface of a second alignment tool in contact with the second planar surface of the movable component;
   placing a second planar surface of the second alignment tool in contact with the planar surface of the nozzle storage block; and
   leveling the planar surface of the nozzle storage block with the second planar surface of the second alignment tool.

9. The method of claim 1 wherein the substrate holder includes a platen with a planar surface, the first alignment tool includes a second planar surface that is parallel to the first planar surface, and placing the first alignment tool on the substrate holder comprises:
   contacting the second planar surface of the first alignment tool with the planar surface of the platen.

10. The method of claim 9 wherein the substrate holder includes a feature projecting from the planar surface, the feature of the substrate holder is configured to contact a backside of a wafer, and placing the first alignment tool on the substrate holder comprises:
    receiving the feature into a recess in the first alignment tool with a non-contacting relationship.

11. An apparatus for adjusting an alignment of a movable component relative to a substrate holder, the movable component configured to be coupled with a nozzle having a tip, and the movable component including a planar surface, the apparatus comprising:
    an alignment tool configured to be removably positioned on the substrate holder, the alignment tool including a first planar surface configured to be contacted by the movable component, a second planar surface configured to be coupled with the substrate holder, and a channel adjacent to the first planar surface, the first planar surface parallel to the second planar surface and spaced relative to the second planar surface along an axis, and the first planar surface spaced from the channel along the axis such that the movable component can contact the first planar surface with the tip of the nozzle in a non-contacting relationship with the alignment tool.

12. The apparatus of claim 11 wherein the alignment tool includes an opening that is aligned with a centerline of the substrate holder, and the opening receives the tip of the nozzle when the first planar surface of the movable component contacts the first planar surface of the alignment tool.

13. The apparatus of claim 11 wherein the first planar surface of the alignment tool and the planar surface of the movable component are in parallel planes when the first planar surface of the movable component is leveled with the first planar surface of the alignment tool.

14. The apparatus of claim 11 wherein the alignment tool includes a first projecting feature and a second projecting feature, and the first projecting feature and the second projecting feature each include a planar surface that partially contributes to the second planar surface of the alignment tool.

15. The apparatus of claim 14 wherein the alignment tool includes a recess disposed between the first projecting feature and the second projecting feature, the recess is arranged to receive a feature projecting from the planar surface of the substrate holder, and the recess has a depth that is greater than a height of the feature of the substrate holder to provide a non-contacting relationship.

16. The apparatus of claim 11 wherein the alignment tool includes a third planar surface configured to be contacted by the movable component, the third planar surface is parallel to the first planar surface, and the third planar surface has a different spacing along the axis from the second planar surface than the first planar surface.

17. The apparatus of claim 16 wherein the channel is located between the first planar surface and the third planar surface, the nozzle has a first width, and the channel has a second width that is greater than the first width of the nozzle.

18. An apparatus for adjusting an alignment of a movable component relative to a nozzle storage block, the movable component configured to be coupled with a nozzle having a tip, the movable component including a planar surface, and the nozzle storage block having a planar surface, the apparatus comprising:

an alignment tool including an arm, a first bracket at a first end of the arm, and a second bracket at a second end of the arm, the first bracket configured to be removably coupled with the movable component and the second bracket configured to be removably coupled with the nozzle storage block, the first bracket including a first planar surface configured to contact the planar surface of the movable component, and the second bracket including a first planar surface configured to contact the planar surface of the nozzle storage block.

19. The apparatus of claim 18 wherein the arm is angled relative to the first bracket and relative to the second bracket to accommodate a difference in a vertical position of the planar surface of the nozzle storage block and the planar surface of the movable component.

20. The apparatus of claim 18 wherein the first bracket includes a second planar surface transverse to the first planar surface of the first bracket, the second bracket includes a second planar surface transverse to the first planar surface of the second bracket, the second planar surface of the first bracket is configured to contact the movable component, and the second planar surface of the second bracket is configured to contact the nozzle storage block.

\* \* \* \* \*